PLURAL LOOP AUTOMATIC PHASE CONTROL

Filed Sept. 27, 1965 3 Sheets-Sheet 1

INVENTOR.
SAMUEL L. BROADHEAD JR.
BY Moody & Gallacher
ATTORNEYS

May 9, 1967 S. L. BROADHEAD, JR 3,319,178

PLURAL LOOP AUTOMATIC PHASE CONTROL

Filed Sept. 27, 1965 3 Sheets-Sheet 2

INVENTOR.
SAMUEL L. BROADHEAD JR.
BY Moody & Hallasher
ATTORNEYS

INVENTOR.
SAMUEL L. BROADHEAD JR.
BY Moody & Gallagher
ATTORNEYS

United States Patent Office 3,319,178

Patented May 9, 1967

3,319,178

PLURAL LOOP AUTOMATIC PHASE CONTROL

Samuel L. Broadhead, Jr., Cedar Rapids, Iowa, assignor to Collins Radio Company, Cedar Rapids, Iowa, a corporation of Iowa Filed Sept. 27, 1965, Ser. No. 490,552

6 Claims. (Cl. 331—2)

This invention relates generally to a stabilized oscillator and particularly to an automatic phase control system.

There are many areas of the electronic field where it is necessary to have an oscillator the frequency of which is constant within very small frequency excursions.

One type of system for controlling the output frequency of an oscillator is an automatic frequency control (AFC). These systems utilize a reference frequency oscillator and a mixer. The mixer receives both the reference oscillator output and the master oscillator output. The frequencies of these outputs are compared and an error signal generated which is proportional to the difference between the two frequencies. This error signal is then used to control the master oscillator such that the error signal is reduced to zero.

A second type of system for frequency stabilizing a master oscillator is a phase lock oscillator which is sometimes called an automatic phase control (APC). In this type of system a reference oscillator and the master oscillator both feed a phase detector. The phase detector senses the difference in phase of the reference frequency and the master oscillator frequency and generates an error signal which is proportional to the phase difference. This error signal is then used to control the master oscillator.

Initially these two systems appear to be quite similar. However, there are fundamental differences in the basic operation of the two systems which render the automatic phase control system preferable to the AFC system. An AFC system requires a finite error in the master oscillator frequency in order for the frequency detector to operate. There is no output from the mixer unless there is a difference between the output frequency of the master oscillator and the output frequency of the reference oscillator. And the output from the mixer is directly proportional to the difference between the two frequencies. The APC system is different from this in that the frequency shift of the master oscillator is first felt as a phase shift by the discriminator. The discriminator can therefore be considered to perform two operations. The first operation is the algebraic comparison of the master oscillator frequency and the reference frequency and the second operation is the integration of this difference from a frequency difference to a phase difference. The APC system therefore operates due to the error of the integral instead of the error of the control frequency. A more detailed description of these well-known systems is found in "A New Look at the Phase-Locked Oscillator," by A. T. McAleer at page 1137 of Proceedings of the IRE, June 1959.

Although both of these systems are frequently used and well-known in the art they both suffer inherent disadvantages. The AFC system has the disadvantage of requiring a finite error in the master oscillator frequency. The AFC and APC systems both have the disadvantage of requiring a reference oscillator the frequency of which is in the order of the frequency of the master oscillator. This can be overcome by the use of binary dividers, as will be explained hereinafter. However, the use of dividers raises the problems of a narrow operational loop bandwidth and high Q rejection filters.

It is therefore an object of this invention to provide a stabilized master oscillator.

It is another object of this invention to provide an automatic phase control system which operates with a relatively high reference frequency.

It is another object to provide an APC which has a wide operational bandwidth and does not require high Q rejection filters.

Further objects, features, and advantages of the invention will become apparent from the following description and claims when read in view of the accompanying drawings wherein like numbers indicate like parts and in which:

Figures 1, 2:
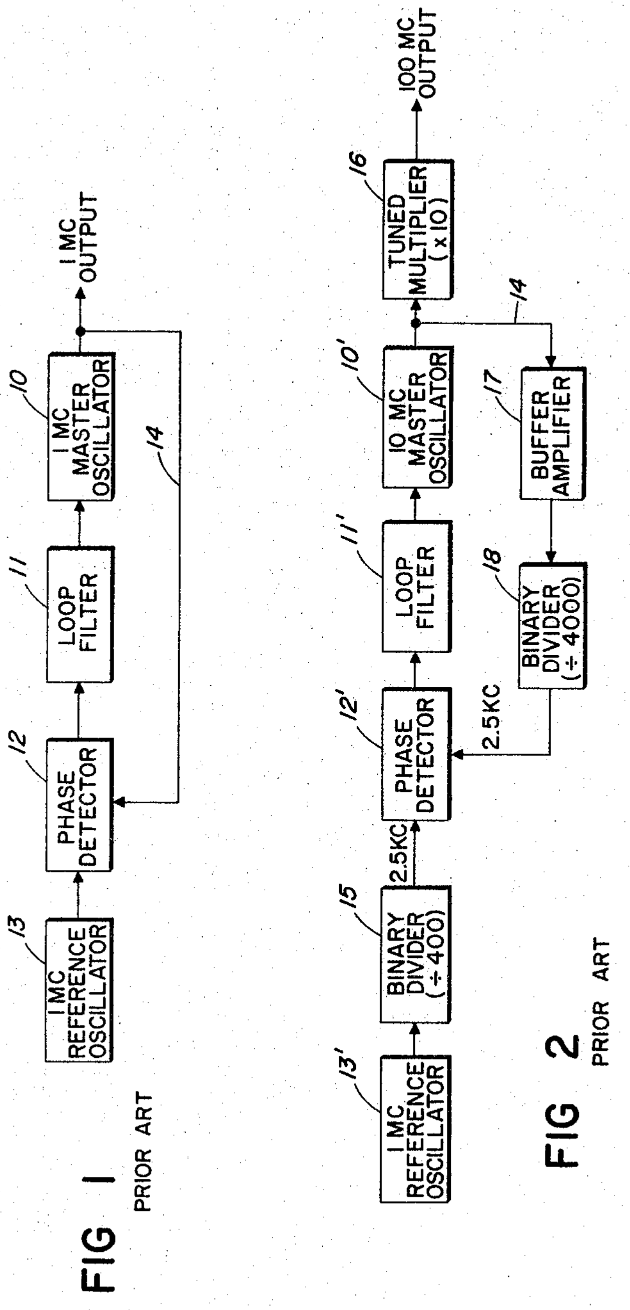
FIGURE 1 is a block diagram which shows the basic APC system.
FIGURE 2 shows a conventional APC system which uses binary dividers to establish signals having frequencies capable of comparison in a phase discriminator.

FIGURE 1 shows the basic APC system from which the system of this invention is derived. The figure shows a master oscillator 10 which has a controlled output frequency of one megacycle. A reference oscillator 13 feeds a phase detector 12 the output of which goes to a loop filter 11 which, in turn, acts as the input to master oscillator 10. The output of oscillator 10 is fed back to phase detector 12 via line 14. Phase detector 12 detects the difference in phase between the output of reference oscillator 13 and master oscillator 10. As the output of master oscillator 10 drifts from the nominal frequency the difference between the two frequencies is first felt as a phase shift by phase discriminator 12. Phase discriminator 12 then generates a signal which is proportional to this phase difference. This error signal is then used to control master oscillator 10 to cause it to return to the nominal frequency. Loop filter 11 is inserted in order to remove the detector frequency from the correction signal.

In this instance the detector frequency is one megacycle.

FIGURE 2 shows an APC system the basic operation of which is the same as that of the elementary system shown in FIGURE 1. In this system a 100 megacycle output is desired. This is obtained by using a 10 megacycle master oscillator 10' and multiplying the output by a factor of 10 in multiplier 16. In this case, the reference oscillator output is a one megacycle frequency while the frequency fed back from master oscillator 10 via line 14 is 10 megacycles. However, two identical frequencies must be fed into phase detector 12' in order to have a useful error signal generated. In order to achieve this necessity the reference oscillator frequency is divided by 400 in binary divider 15. This gives a 2.5 kilocycle frequency input to detector 12. The 10 megacycle output of master oscillator 10' is divided by 4000 in binary divider 18. This also achieves a 2.5 kilocycle input to phase detector 12'. Phase detector 12' therefore compares the 2.5 kilocycle signals and generates an error signal according to their phase differences.

Loop filter 11' is included in order to filter out the 2.5 kilocycle frequency to assure that only the error signal is fed to master oscillator 10. The system shown in FIGURE 2 has the disadvantage of requiring a low frequency comparision in the phase detector 12. This leads to a restriction of the control loop bandwidth to a relatively low frequency in order that the loop filter may reject the discriminator frequency which, in this case, is 2.5 kilocycles. If the division ratios of binary dividers 15 and 18 were decreased by a factor of 10 such that binary divider 15 divided by 40 and divider 18 divided by 400 a 25 kilocycle signal would be compared by phase discriminator 12. This is theoretically desirable but is physically impractical. This is so because loop filter 11 is then required to attenuate the 25 kilocycle signal by approximately 100 db in order to assure a clean error signal to control master oscillator 10. As a practical matter a loop filter capable of attenuating a 25 kilocycle frequency 100 db is very difficult, if not impossible, to design.

Figure 3:
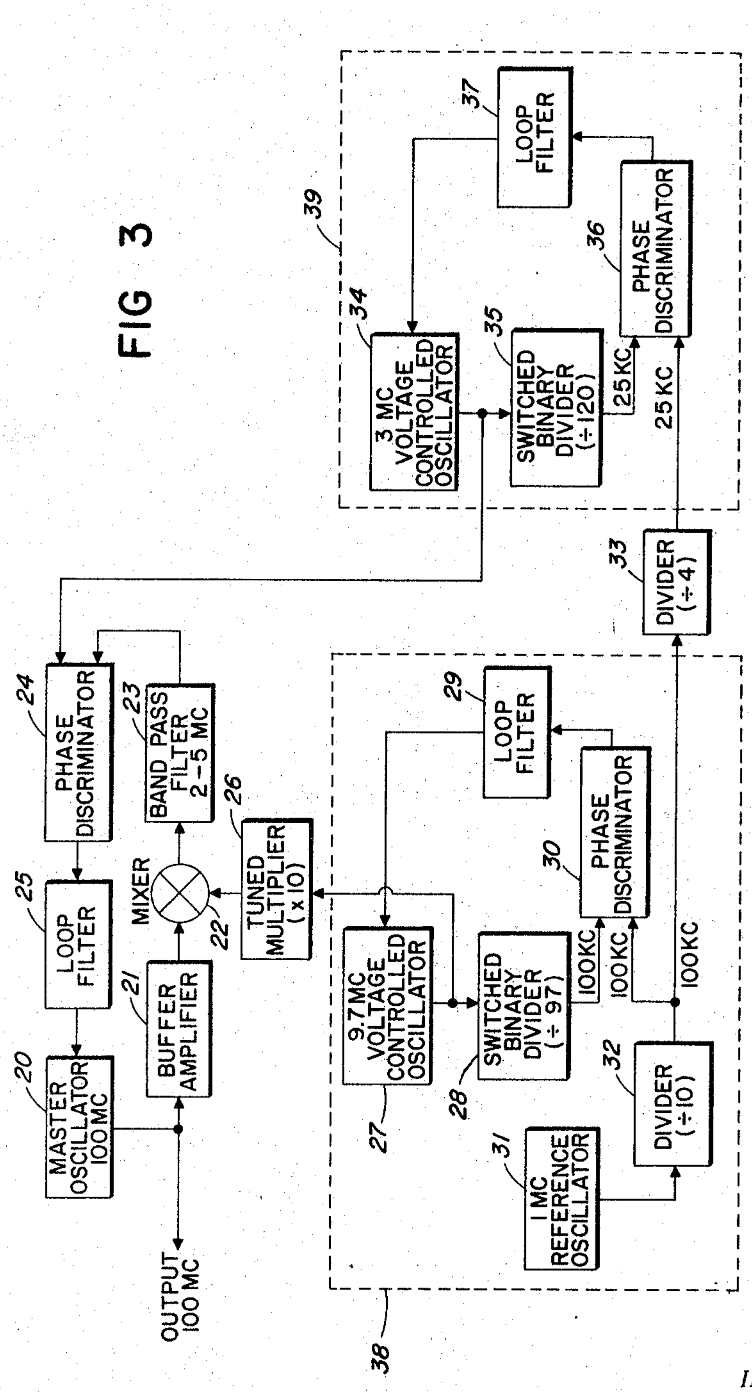
FIGURE 3 shows one embodiment of the APC system of this invention.

FIGURE 3 shows the one embodiment of the inventive system. In this system it is desirable to control the master oscillator 20 such that its output has a nominal 100 megacycle frequency. This is done by use of reference oscillator 31 the output of which is one megacycle. The portions of the circuits indicated as 38 and 39 and enclosed in the broken lines are similar to the basic circuit shown in FIGURE 2.

The output of a 10 megacycle oscillator 27 is divided by 100 in binary divider 28. The output of this divider is therefore 100 kilocycles. The one megacycle output of reference oscillator 31 is divided by 10 in binary divider 32. This also yields a 100 kilocycle output. These outputs are compared in phase discriminator 30 the output of which is an error signal which controls the output of oscillator 27 through loop filter 29. The 100 kilocycle output from divider 32 is further divided by four in binary divider 33. This gives a 25 kilocycle output which is used as a reference frequency for the APC system 39. The output of a three megacycle oscillator 34 is divided by 120 in binary divider 35. This yields a 25 kilocycle output. The two 25 kilocycle signals are compared in phase detector 36 the error signal of which controls oscillator 34 through loop filter 37. The output of APC system 38 is multipled by a factor of 10 in multiplier 26 and then fed to mixer 22 where it is mixed with the output frequency of master oscillator 20. The output of mixer 22 is a signal which is proportional to the frequency excursion of master oscillator 20 from nominal. The nominal frequency of the output of multiplier 26 is chosen to differ from the nominal frequency of master oscillator 20 by 3 megacycles. This affects the division factor of binary divider 28. This division factor is chosen to produce a 100 kilocycle output of binary divider 28. The output signal of mixer 22 is therefore a 3 megacycle signal when master oscillator 20 is operating on frequency. However, when master oscillator 20 is off frequency the output of mixer 22 differs from 3 megacycles by the frequency error of master oscillator 20. The mixer 22 output is fed to bandpass filter 23 which is designed to have a bandwidth of 2–5 megacycles. The output of filter 23 is then fed to phase discriminator 24. The output of APC system 39 will be a nominal three megacycle signal which is also fed to phase detector 24. Discriminator 24 therefore receives two different three megacycle inputs. When oscillator 20 is operating at nominal frequency, filter 23 supplies no erroneous signal to detector 24 and no signal is generated by the detector 24. When nominal operation does not exist filter 23 supplies a signal having a frequency other than 3 megacycles to detector 24 which then generates a correction signal which is proportional to the error. The output of detector 24 is a correction signal which is used to cause master oscillator 20 to return to the nominal frequency. The correction signal is applied through filter 25. It should be noted that loop filters 25, 29, and 37 are used to reject the frequency of the phase detectors in which they are connected. This system is advantageous because the phase detectors compare signals at comparatively high frequencies and therefore the operational bandwidth can be comparatively wider. This is permissible because each detector output is filtered at least twice before it is applied to the master oscillator 20. For this reason a 100 db attenuation can easily be achieved because 50 db can be obtained at each filter. It is therefore unnecessary to have a critical bandwidth in any of these filters.

Figure 4:
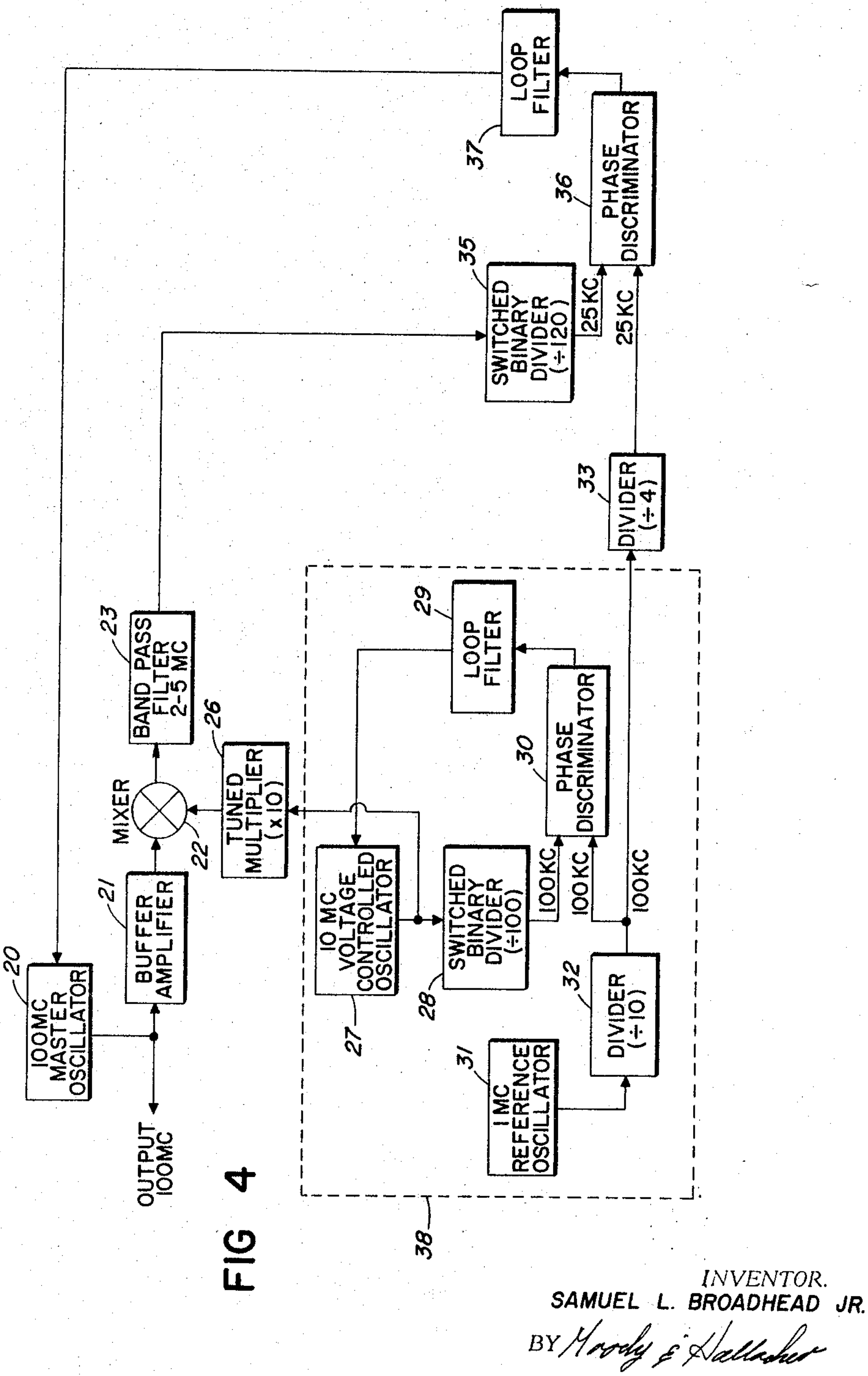
FIGURE 4 shows a second embodiment of the APC system of this invention.

FIGURE 4 shows a second embodiment of the inventive system. This system is very similar to that of FIGURE 3. However, loop filter 25, phase detector 24, and oscillator 34 are eliminated from this system. The output of bandpass filter 23 is fed to binary divider 35 to where it is divided by 120 to yield a 25 kilocycle output. This output is compared with the 25 kilocycle output from divider 33 in phase discriminator 36. The output of discriminator 36 is used to control master oscillator 20 through loop filter 37. This embodiment is advantageous in the elimination of one oscillator and one phase discriminator. However, it suffers the disadvantage of requiring a higher Q filter 37. The filter requirement is not as critical as it is with the circuit shown in FIGURE 2 because the 25 kilocycle signal which is initiated in APC 38 is filtered at filter 29 and divided at binary divider 35. This signal is therefore quite "clean" before reaching phase discriminator 36. The 25 kilocycle signal initiated at reference oscillator 31 and fed through dividers 32 and and 33 is relatively "clean" because it is subjected to two separate divisions. Also because the other signal is relatively "clean" the possibility of adding undesirable frequency components in the two signals is greatly decreased.

Although this invention has been described with respect to particular embodiments thereof, it is not to be so limited as changes and modifications may be made therein which are within the spirit and scope of the invention as defined by the appended claims.

I claim:

1. A system for providing a stabilized frequency comprising: a master oscillator and a reference oscillator, first dividing means for dividing the output of said reference oscillator by a first integer to provide a first divided signal, second dividing means for dividing the output of said reference oscillator by a second integer to provide a second divided signal, first means for receiving said first divided signal to produce a first reference signal of the same order as the frequency of said master oscillator, second means for receiving said first reference frequency and the output of said master oscillator to produce a first error signal proportional to the difference between said first reference signal and said master oscillator output, third divider means for dividing said first error signal, detector means for receiving said second divided signal and said divided error signal to produce a second error signal, and means for applying said second error signal to said master oscillator to control the output of said master oscillator.

2. The frequency system of claim 1 wherein said first means for receiving includes a third oscillator and a multiplier, and said second means for receiving includes a mixer.

3. A stabilized frequency source comprising: a master oscillator and a reference oscillator, the output frequencies of said oscillators being different, means for providing a first multiple of said reference oscillator frequency as a first reference signal, said means for providing a first multiple comprising a first voltage sensitive oscillator, a first divider, and a first phase discriminator, said discriminator receiving the output of said first divider and a first submultiple of said reference oscillator frequency to produce a first control signal, said first control signal being coupled to said first voltage sensitive oscillator so that said first oscillator produces said first multiple as said first reference signal, means for providing a second multiple of said reference oscillator frequency as a second reference signal, means for mixing said first reference signal and said master oscillator output to provide a third reference signal, the frequencies of said second and third reference signals being of the same order, means for detecting said second and third reference signals to produce an error signal proportional to the difference between said reference signals, and means for coupling said error signal to said master oscillator to control the output frequency of said master oscillator.

4. The frequency source of claim 3 wherein said means for providing a second multiple comprises a second voltage sensitive oscillator, a second divider, a second phase discriminator, said second discriminator receiving the output of said second voltage sensitive oscillator and a second submultiple of said reference oscillator frequency to produce a second control signal, said second control signal being coupled to said second voltage sensitive oscillator so that said second oscillator produces said second multiple as said second reference signal.

5. A system for providing a stabilized frequency comprising: a master oscillator and a reference oscillator, first multiplying means for multiplying the output of said reference oscillator by a first integer to provide a first reference signal of a particular frequency, said first multiplying means comprising a first voltage sensitive oscillator, a first divider, and a first phase discriminator, said discriminator receiving the output of said first divider and a first submultiple of said reference oscillator frequency to produce a first control signal, said first control signal being coupled to said first voltage sensitive oscillator so that said first oscillator produces said first multiple as said first reference signal second multiplying means for multiplying the output of said reference oscillator by a second integer to provide a second reference signal having another particular frequency, means for detecting said first reference signal and the output of said master oscillator to produce a first error signal proportional to the difference in phase between said signals, means for detecting said first error signal and said second reference signal to produce a second error signal, and means for applying said second error signal to said master oscillator to control the output frequency of said master oscillator.

6. The frequency source of claim 5 wherein said second multiplying means comprises a second voltage sensitive oscillator, a second divider, a second phase discriminator, said second discriminator receiving the output of said second voltage sensitive oscillator and a second submultiple of said reference oscillator frequency to produce a second control signal, said second control signal being coupled to said second voltage sensitive oscillator so that said second oscillator produces said second multiple as said second reference signal.

References Cited by the Examiner

UNITED STATES PATENTS

| | | | |
|---|---|---|---|
| 2,786,140 | 3/1957 | Lewis | 331—2 |
| 2,888,562 | 5/1959 | Robinson | 331—2 |
| 2,964,714 | 12/1960 | Jakubowics | 331—2 |

ROY LAKE, *Primary Examiner.*

JOHN KOMINSKI, *Examiner.*